United States Patent
Kim

(10) Patent No.: US 6,466,628 B1
(45) Date of Patent: Oct. 15, 2002

(54) TECHNIQUE FOR EFFECTIVELY RENDERING POWER AMPLIFICATION AND CONTROL IN WIRELESS COMMUNICATIONS

(75) Inventor: Helen Haeran Kim, Holmdel, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/061,845

(22) Filed: Apr. 18, 1998

(51) Int. Cl.[7] .......................... H03G 3/20; H04L 27/20
(52) U.S. Cl. ...................... 375/297; 455/126; 330/284; 330/85
(58) Field of Search .................. 375/296, 297; 455/126; 330/278, 284, 85

(56) References Cited

U.S. PATENT DOCUMENTS

| | | | |
|---|---|---|---|
| 5,483,681 A | | 1/1996 | Bergsten et al. |
| 5,507,017 A | * | 4/1996 | Whitmarsh et al. .......... 455/126 |
| 5,894,496 A | * | 4/1999 | Jones .......................... 455/126 |
| 6,008,697 A | * | 12/1999 | Sparks ........................ 330/279 |

FOREIGN PATENT DOCUMENTS

| | | |
|---|---|---|
| JP | 3-254211 | 11/1991 |
| JP | 8-204774 | 8/1996 |
| JP | 9-261292 | 10/1997 |

OTHER PUBLICATIONS

A. Bateman et al., "Linear Transceiver Architectures," *IEEE Conf. Vt–88*, Philadelphia, Jun. 1988, pp. 478–484.
V. Petrovic, "Reduction of Spurious Emission from Radio Transmitter by Means of Modulation Feedback," *IEE Conference on Radio Spectrum Conservation Techniques*, Sep. 1983, pp. 44–49.
A. Bateman et al., "Direct Conversion Transceiver Design for Compact Low–cost Protable Mobile Radio Terminals," *IEEE Vehic. Tech. Conf.*, 1989, pp. 57–62.
V. Petrovic et al., " Reduction of Intermodulation Distortion by Means of Modulation Feedback," *IEE Colloquium on Intermodulation Cause, Effect and Mitigation*, London, England, Apr. 9, 1984, pp. 8/1–8/8.

* cited by examiner

Primary Examiner—Amanda T. Le
(74) Attorney, Agent, or Firm—Ryan, Mason & Lewis, LLP

(57) ABSTRACT

In a wireless transmitter, a class B or class C amplifier is used as a power amplifier for boosting the power level of a signal to be transmitted. To linearize the power amplifier, a feedback mechanism is included in the transmitter. The feedback mechanism provides for adjustment of a feedback gain which affects the overall gain of the signal, thereby effectively controlling the signal power level. In addition, a phase difference between components of the signal and the feedback versions thereof is corrected to increase the linearity of the power amplifier and stabilize the feedback mechanism.

41 Claims, 2 Drawing Sheets

TECHNIQUE FOR EFFECTIVELY RENDERING POWER AMPLIFICATION AND CONTROL IN WIRELESS COMMUNICATIONS

FIELD OF THE INVENTION

The invention relates to communications systems and methods, and more particularly to a system and method for realizing high power efficiency in wireless transmission and effective control of transmission power.

BACKGROUND OF THE INVENTION

It is well known that with no excitation applied to an amplifier, an operating point, known as a "quiescent point" or "DC operating point," is defined in an active region of the output characteristics of the amplifier. To provide linear amplification for a radio-frequency (RF) input signal for example, a class A amplifier is normally used, which is typically biased to place the DC operating point far enough from both cutoff and saturation regions in its output characteristics. As a result, the input signal excursions to either side of the operating point do not cause the signal to be cut off or the amplifier to be saturated, thus avoiding introducing distortion into the signal. However, a major drawback of the class A amplifier is its low power efficiency due to a relatively high DC input power required by the amplifier, with respect to its output signal power.

A class B amplifier is typically biased to cut off a half-cycle of an input signal, with an output current flow only during the positive half-cycle of the signal. As a result, the amplifier output is significantly distorted, with respect to the input signal. Thus, a class B amplifier is unsuitable for a typical linear operation. However, with respect to a class A amplifier, a class B amplifier affords higher power efficiency as the DC input power to the amplifier is relatively low.

A class AB amplifier, on the other hand, is typically biased in such a way that the output current flows for more than half of the cycle of the input signal. As a result, a class AB amplifier behaves like a hybrid between the class A and class B amplifiers. Thus, a class AB amplifier causes a lower distortion than a class B amplifier (but a higher distortion than a class A amplifier) to an input signal at a high power level. At the same time, the class AB amplifier realizes higher power efficiency than a class A amplifier.

A class C amplifier is typically biased in such a way that the output current flows less than half of the cycle of the input signal. As a result, the class C amplifier affords the highest power efficiency and, unfortunately, also distortion to an input signal of all of the aforementioned amplifiers.

A power amplifier is typically used in a transmitter of a digital wireless communications system, e.g., personal communications service (PCS) system, to boost the power level of a digitally modulated signal for transmission thereof. In wireless communications, the power amplifier is required to afford linear amplification to the signal, without introducing significant distortion thereinto. As such, in the prior art, the power amplifier used in a wireless transmitter typically operates in a class A and/or class AB mode to satisfy the linear amplification requirement.

However, for example, a transmitter in a wireless telephone handset is normally powered by a rechargeable battery having a limited capacity. The usable transmission time allowed by the battery before recharging thereof increases with the power efficiency afforded by the power amplifier in the transmitter. Since a long allowable transmission time, and accordingly high amplifier power efficiency, is always desired, the prior art power amplifier operating in a class A and/or class AB mode is deficient in that it affords relatively low power efficiency, compared with a class B or class C amplifier.

Nevertheless, it is well known that where a class B or class C amplifier is used, a feedback mechanism may be employed to "linearize" the amplifier to afford substantially linear amplification.

SUMMARY OF THE INVENTION

It appears that a class B or class C amplifier can be used as the power amplifier in the prior art wireless communications system to increase the power efficiency, in conjunction with the aforementioned feedback mechanism which helps linearize the class B or class C amplifier. However, I have recognized that in such an arrangement, because of the feedback mechanism, a gain control in the prior art wireless communications system which is normally used for controlling the transmission power level can no longer be effectively used for that purpose. Such ineffective power control is particularly disadvantageous in wireless communications as the transmission power requirement frequently changes.

In accordance with the invention, a second gain control is incorporated in the above feedback mechanism to impart a selected gain in a feedback version of a transmitted signal, thereby effectively control an overall gain, and thus the power level, of the transmitted signal. A difference between a phase of the transmitted signal and that of the feedback version thereof is also reduced to increase the linearity of the power amplifier and stabilize the feedback mechanism.

BRIEF DESCRIPTION OF THE DRAWING

Throughout this disclosure, unless otherwise stated, like elements, components or sections in the figures are denoted by the same numeral.

DETAILED DESCRIPTION

Figure 1:
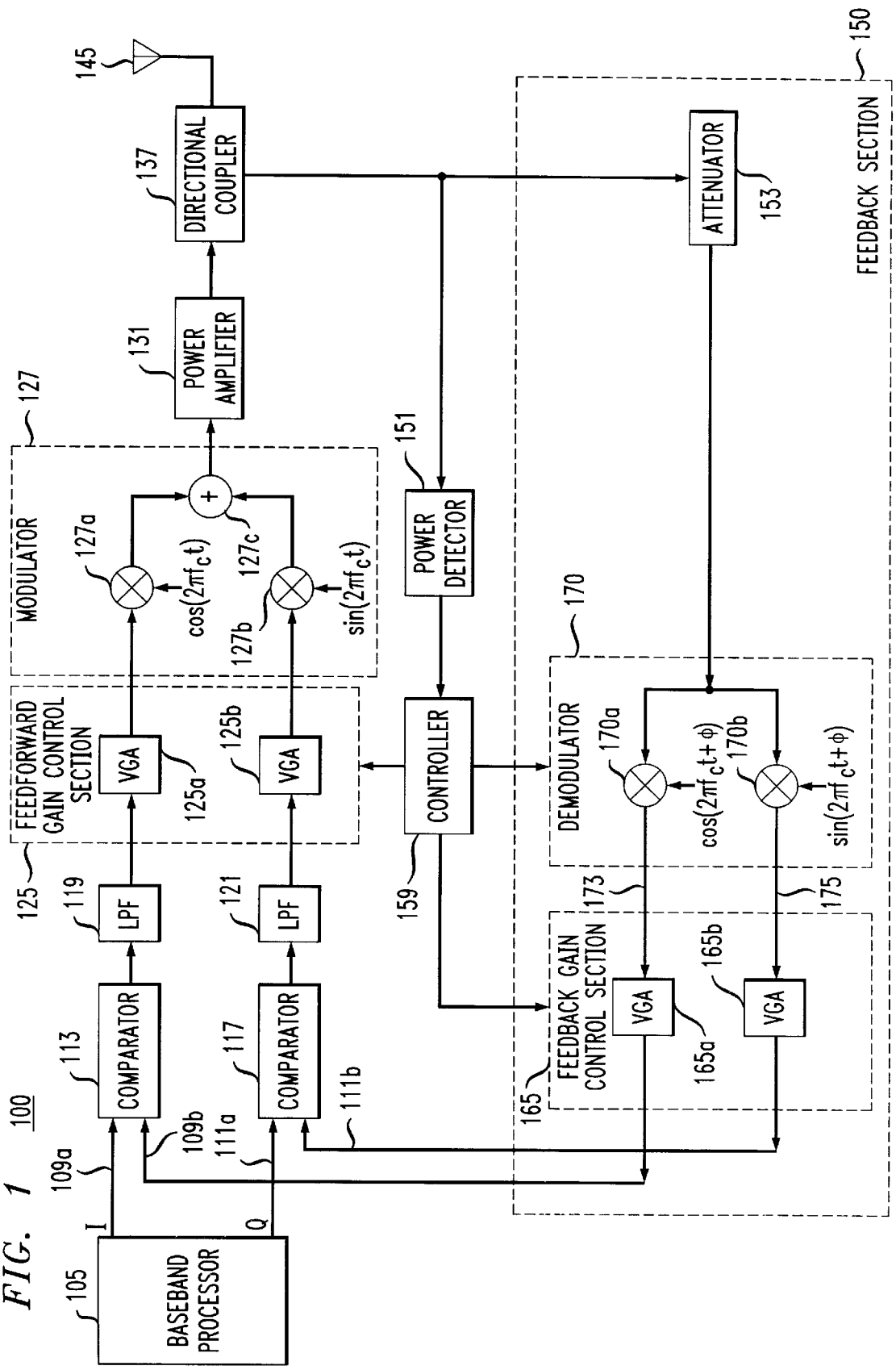
FIG. 1 is a block diagram of a wireless transmitter in accordance with the invention.

FIG. 1 illustrates wireless transmitter 100 embodying the principles of the invention which may be used in a wireless communications system, e.g., a wireless telephone handset in this instance. In transmitter 100, baseband processor 105 of conventional design receives an analog signal representing, e.g., voice information from the handset. In response to the received signal, processor 105 generates a bit stream representing the voice information, and processes k bits from the bit stream at a time, where k is an integer greater than one. Specifically, based on each k bit ensemble, processor 105 selects one of $2^k$ predetermined symbols differing in their phases in a signal constellation, in accordance with a well known quaternary phase shift keying (QPSK) modulation scheme. The selected symbol corresponding to the k bits is represented by an in-phase (I) signal and a quadrature-phase (Q) signal, which are provided by processor 105 onto leads 109*a* and 111*a*, respectively.

Comparator 113, e.g., a conventional differential amplifier, is used to compare the amplitude of the I signal on lead 109*a* with that of a feedback I signal on lead 109*b*. Similarly, comparator 117 is used to compare the amplitude of the Q signal on lead 111*a* with that of a feedback Q signal on lead 111*b*. The feedback I and Q signals come from feedback section 150 described below, which is not included in a prior art wireless transmitter using a class A or class AB amplifier as the power amplifier therein. Each of comparators 113 and 117 outputs a signal, known as an "error signal," representing a difference between the amplitudes of the respective input signals to the comparator. It suffices to know for now that the resulting error signals from comparators 113 and 117 constitute negative feedback to power amplifier 131, which in this instance is a class B or class C amplifier, to afford relatively high power efficiency, with respect to a class A or class AB amplifier used in the prior art wireless transmitter.

In a wireless communication system pursuant to, e.g., the North American cellular or personal communications service (PCS) standards, power amplifier 131 is required to afford substantially linear amplification to a signal to be transmitted, without introducing significant distortion thereinto. Although power amplifier 131 which is a class B or class C amplifier normally affording non-linear amplification, the aforementioned negative feedback in a well known manner causes amplifier 131 to be substantially "linearized," thereby effectively preventing any transmitted signal distortion attributed to the non-linear amplification which would otherwise adversely affect the wireless communications. As a result, transmitter 100 fully meets the above standards.

The error signals from comparators 113 and 117 are respectively filtered by low pass filters (LPFs) 119 and 121 to limit their respective basebands. For example, the cutoff frequency of LPFs 119 and 121 may be about 1 MHz in accordance with the North American cellular or PCS IS-95 standards. The filtered signals are then fed to feedforward gain control section 125 comprising variable gain amplifiers (VGAs) 125*a* and 125*b*. Accordingly, VGAs 125*a* and 125*b* each impart a forward gain to the filtered signals. The specific gains imparted by VGAs 125*a* and 125*b* are determined by controller 159, and are typically used in the prior art wireless transmitter to adjust its transmission power level to effect power control as required in the wireless communications.

Thus, like a controller in the prior art wireless transmitter, controller 159 from time to time receives from a remote base station serving transmitter 100 a signal containing information concerning, among other things, the amount of required transmission power level for current transmission. In a conventional manner, controller 159 compares the required transmission power level with the present level detected by power detector 151 described below. Knowing any difference between the required and present transmission power levels, controller 159 outputs power control signals to accordingly adjust the present level to meet the required level.

However, unlike the prior art controller, controller 159 sends the power control signals not only to forward gain control section 125, but also to feedback gain control section 165 which provides a selected feedback gain in accordance with the invention. This stems from my recognition that because of the aforementioned negative feedback in transmitter 100, the forward gain alone can no longer be used to effectively adjust the transmission power as required. In fact, if transmitter 100 were devoid of feedback gain control section 165, i.e., by setting the feedback gain therein to a constant, e.g., one, it can be shown that by virtue of the negative feedback, the power level of the ultimate signal transmitted by transmitter 100 could never exceed a given input power determined by the power level of the I and Q signals, no matter what the forward gain is, thus failing to effect any overall power amplification.

In accordance with the invention, section 165 is included to allow effective control of the transmission power. Thus, in response to the aforementioned power control signal from controller 159, VGA 165*a* and VGA 165*b* in section 165 impart a selected feedback gain to the feedback I and Q signals, respectively, which effectively affects the overall gain of the ultimate, transmitted signal. As a result, the power level of the transmitted signal readily meets the transmission power requirement imposed by the base station.

The above amplified signals from VGAs 125*a* and 125*b* are used to respectively modulate two orthogonal carriers having a frequency $f_c$ in modulator 127. Illustratively, the signal from VGA 125*a* is multiplied by $\cos(2\pi f_c t)$ using mulitiplier 127*a* in modulator 127, where t denotes time. At the same time, the signal from VGA 125*b* is multiplied by $\sin(2\pi f_c t)$ using multiplier 127*b*. The resulting modulated signals are summed at adder 127*c*, resulting in a double sideband carrier signal. The power level of this signal is boosted by power amplifier 131 described above, with its resulting power level meeting the current transmission power requirement. The power-amplified signal is routed by directional coupler 137 to antenna 145 for transmission thereof, thereby realizing wireless communication of the voice information in the transmit direction.

At the same time, coupler 137 feeds back an identical version of the transmitted signal to both power detector 151 and attenuator 153 in feedback section 150. Power detector 151 of conventional design detects the power level of the transmitted signal, and thus the current transmission power level in transmitter 100. Power detector 151 sends a signal representative of the detected power level to controller 159, where the received signal is processed to control the transmission power as described before. Attenuator 153 is used to reduce the power level of the transmitted signal by a predetermined factor. The attenuated signal is fed to demodulator 170.

It should be noted at this point that in order to effectively linearize power amplifier 131 and stabilize the feedback loop in feedback section 150, the phase difference between the I signal on lead 109a and the feedback I signal on lead 109b, and an identical phase difference between the Q signal on lead 111a and the feedback Q signal on lead 111b, need to be controlled. This phase difference, denoted φ, arises from a time lag of each feedback signal behind its counterpart due to the propagation delay (e.g., incurred by the feedback loop) and processing delay (e.g., incurred by power amplifier 131) imposed on the feedback signal.

Illustratively, the phase difference φ is corrected by shifting the phase of the demodulating carriers used in demodulator 170 by φ, with respect to the modulating carriers used in modulator 127. As fully described below, demodulator 170 is used to recover a version of the I and Q signals based on the attenuated, transmitted signal from attenuator 153. Thus, in this instance, the demodulating carriers used in demodulator 170 are $\cos(2\pi f_c t + \phi)$ and $\sin(2\pi f_c t + \phi)$, respectively. The actual value of φ is provided by controller 159 to demodulator 170. This value needs to be initialized when transmitter 100 is powered on, and revised when the required transmission power is changed.

In this particular illustrative embodiment, power amplifier 131, and thus its processing delay which varies with different transmission power required thereof, is fully characterized. Since other delays including the propagation delay is virtually constant, the necessary phase shifts, i.e., φ's, corresponding to the different transmission power levels can be predetermined, and stored in a memory (not shown) in controller 159. Thus, when φ needs to be initialized or changed, controller 159 retrieves from the memory the φ value corresponding to the transmission power level requirement from the base station. Controller 159 then sets the feedforward gain of VGAs 125a and 125b, which determines the input power level of power amplifier 131. At the same time, controller 159 sends the retrieved φ information to demodulator 170 to effect the necessary phase shift. Controller 159 thereafter sets the feedback gain of VGAs 165a and 165b to achieve the required transmission power level. A second embodiment involving use of a phase detector to determine in real time the amount of the necessary phase shift is described below.

In any event, based on the φ value received from controller 159, demodulator 170 uses multiplier 170a to multiply the attenuated, transmitted signal from attenuator 153 and $\cos(2\pi f_c t + \phi)$ incorporating the received φ value, and multiplier 170b to multiply same and $\sin(2\pi f_c t + \phi)$ also incorporating the received φ value. As mentioned before, the demodulated signal from multiplier 170a represents a version of the I signal on lead 109a. Similarly, the demodulated signal from multiplier 170b represents a version of the Q signal on lead 110a. The demodulated signals are fed to feedback gain control section 165 through leads 173 and 175, respectively. VGA 165a and 165b in section 165 respectively impart a selected feedback gain to the demodulated signals, in response to a power control signal from controller 159 as described before. The resulting signals from VGA 165a and 165b comprise the aforementioned feedback I signal and feedback Q signal, which are provided onto leads 109b and 111b, respectively.

Figure 2:
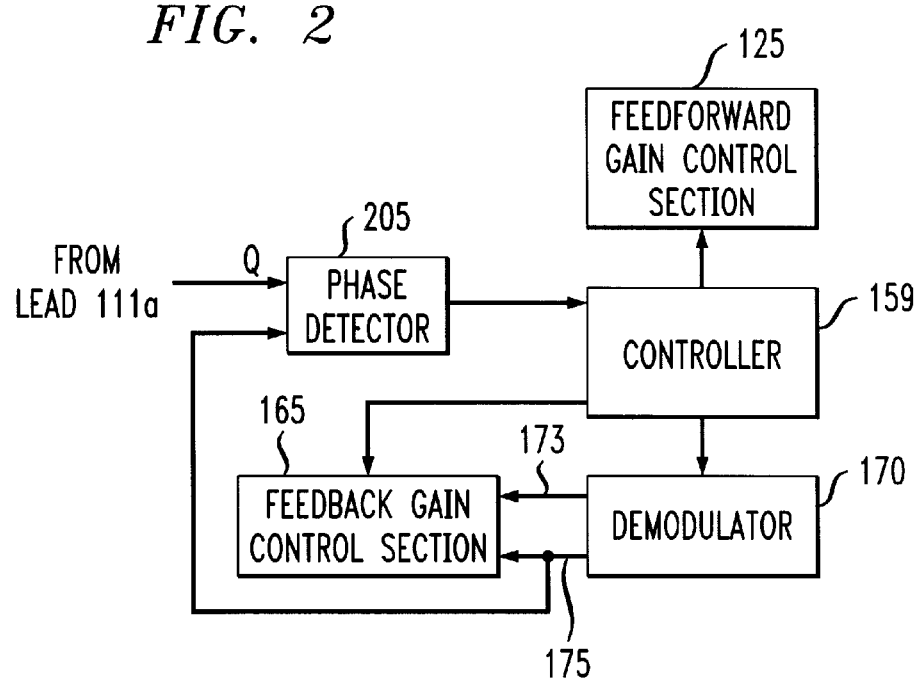
FIG. 2 illustrates an arrangement for detecting a difference between the phase of a signal and that of a feedback version thereof in the transmitter of FIG. 1.
Figure 3:
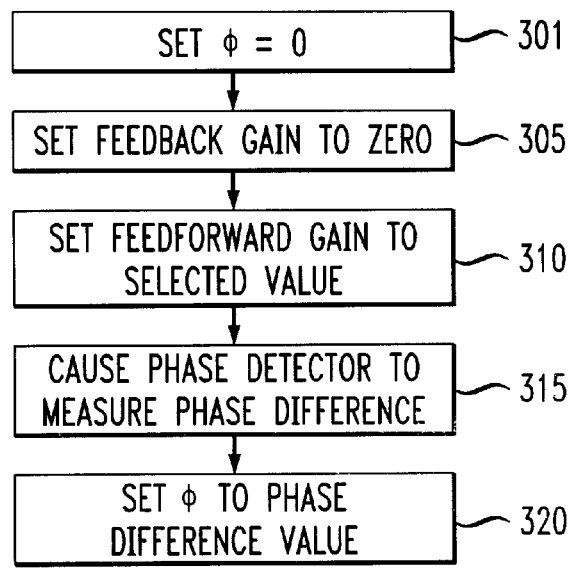
FIG. 3 is a flow chart depicting the steps of a routine for detecting the phase difference and effecting a phase shift based on the detected difference in the transmitter of FIG. 1.

The second embodiment involving use of a phase detector for determining in real time the phase difference φ between the Q (or I) signal and the feedback Q (or I) signal will now be described. FIG. 2 shows only the relevant components of transmitter 100 which are in cooperation with the phase detector, denoted 205, to detect the phase difference. FIG. 3 illustrates routine 300 stored in the memory of controller 159 for detecting such a phase difference, thereby effecting the phase shift based thereon.

Referring to both FIGS. 2 and 3, when transmitter 100 is powered on or when the required transmission power needs to be changed, instructed by routine 300, controller 159 sets the φ value in demodulator 170 to zero, as indicated at step 301. At step 305, controller 159 sets the feedback gain of the VGAs in section 165 to zero, thereby opening the feedback loop. Upon learning the current, required transmission power level from the base station, controller 159 at step 310 sets the feedforward gain of the VGAs in section 125 to a selected value, thereby causing power amplifier 131 to deliver the required transmission power level. At step 315, controller 159 causes phase detector 205 to measure the phase difference between the Q signal on lead 111a and the demodulated signal on lead 175 corresponding to the feedback Q signal. Upon learning the detected phase difference from detector 205, controller 159 at step 320 sets the φ value in demodulator 170 to the detected phase difference value to effect the necessary phase shift.

The foregoing merely illustrates the principles of the invention. It will thus be appreciated that a person skilled in the art will be able to devise numerous arrangements which, although not explicitly shown or described herein, embody the principles of the invention and are thus within its spirit and scope.

For example, transmitter 100 is disclosed herein in a form in which various transmitter functions are performed by discrete functional blocks. However, any one or more of these functions could equally well be embodied in an arrangement in which the functions of any one or more of those blocks or indeed, all of the functions thereof, are realized, for example, by one or more appropriately programmed processors.

I claim:

1. Apparatus for transmitting a first signal having a power level which is indicated by a second signal, the second signal being received by the apparatus, the apparatus comprising:
    a mechanism for feeding a version of the first signal back to the apparatus via a feedback signal path;
    feedforward gain control circuitry operatively coupled in a feedforward signal path of the apparatus, the feedforward gain control circuitry being responsive to the version of the first signal for changing the power level of the first signal;
    feedback gain control circuitry operatively coupled in the feedback signal path, the feedback gain control circuitry being responsive to the version of the first signal for changing a gain of the version of the first signal fed back to the apparatus; and
    a controller operatively coupled to the feedforward gain control circuitry and feedback gain control circuitry, the controller being responsive to the second signal for imparting a selected gain to the version of the first signal to control the power level of the first signal.

2. The apparatus of claim 1 wherein the first signal represents a selected symbol.

3. The apparatus of claim 2 wherein the symbol is selected in accordance with a quaternary phase shift keying (QPSK) scheme.

4. The apparatus of claim 1 comprising a transmitter in a wireless telephone handset.

5. The apparatus of claim 1 wherein the amplifier includes a class B amplifier.

6. The apparatus of claim 1 wherein the amplifier includes a class C amplifier.

7. The apparatus of claim 1 further comprising a memory for storing information concerning a difference between a phase of the version of the first signal and that of the first signal.

8. The apparatus of claim 7 wherein the controller adjusts the phase of the version of the first signal based on the information.

9. Apparatus for processing a signal to be transmitted comprising:
   a controller for generating a first control signal and a second control signal which represent a first selected gain and a second selected gain, respectively;
   a first gain control operatively coupled in a feedforward signal path of the apparatus and being responsive to the first control signal for modifying a signal level of the signal to be transmitted;
   a processor for providing a feedback signal representative of a version of the signal to be transmitted having the modified signal level;
   an attenuator for imparting a predetermined attenuation to the feedback signal; and
   a second gain control operatively coupled in a feedback signal path of the apparatus, the second gain control being responsive to the feedback signal and the second control signal for changing a power level of the signal to be transmitted.

10. The apparatus of claim 9 wherein the signal to be transmitted represents a selected symbol.

11. The apparatus of claim 10 wherein the symbol is selected in accordance with a QPSK scheme.

12. The apparatus of claim 9 comprising a transmitter in a wireless telephone handset.

13. A system for communicating a signal comprising:
   a coupler for feeding a version of the signal back to the system via a feedback signal path;
   a feedforward gain control operatively coupled in a feedforward signal path, the feedforward gain control imparting a selectable feedforward gain to the signal;
   a feedback gain control operatively coupled in the feedback signal path, the feedforward gain control imparting a selectable feedback gain to the version of the signal; and
   a controller for selecting a value of the feedforward gain and the feedback gain to control a power level of the signal.

14. The system of claim 13 comprising a wireless communications system.

15. The system of claim 14 wherein the wireless system includes a wireless telephone handset.

16. The system of claim 13 further comprising a transmitter for transmitting the signal.

17. The system of claim 13 wherein each of the feedforward gain control and the feedback gain control include at least one variable gain amplifier.

18. The system of claim 13 wherein the controller selects the values of the feedforward gain and the feedback gain in response to a change in the power level of the signal.

19. A system for communicating a signal comprising:
   a feedforward gain control for adjusting a power level of the signal;
   a mechanism for feeding a version of the signal back to the system via a feedback signal path;
   a feedback gain control operatively coupled in the feedback signal path for adjusting a gain of the version of the signal; and
   a detector for measuring a difference between a phase of the version of the signal and that of the signal when the power level of the signal is adjusted to a selected level.

20. The system of claim 19 further comprising a controller for adjusting the phase of the version of the signal based on the difference.

21. The system of claim 19 wherein the phase of the version of the signal is adjusted-by incorporating the difference into a demodulator for demodulation of the version of the signal.

22. The system of claim 19 further comprising an amplifier for changing the power level of the signal.

23. The system of claim 22 wherein the amplifier includes a class B amplifier.

24. The system of claim 22 wherein the amplifier includes a class C amplifier.

25. The system of claim 19 further comprising a comparator for comparing an amplitude of the version of the signal with that of the signal.

26. The system of claim 19 wherein the power level of the signal is a function of a difference between an amplitude of the version of the signal and that of the signal.

27. A method for use in an apparatus for transmitting a first signal having a power level which is indicated by a second signal, the second signal being received by the apparatus, the method comprising the steps of:
   feeding a version of the first signal back to the apparatus;
   changing a power level of the first signal in response to the version of the first signal;
   imparting a selected gain to the version of the first signal to control the power level of the first signal; and
   imparting a selected gain to the first signal in response to the version of the first signal for changing the power level of the first signal.

28. The method of claim 27 wherein the first signal represents a selected symbol.

29. The method of claim 28 wherein the symbol is selected in accordance with a QPSK scheme.

30. The method of claim 27 further comprising the step of storing information concerning a difference between a phase of the version of the signal and that of the signal.

31. The method of claim 30 wherein the phase of the version of the signal is adjusted based on the information.

32. A method for processing a signal to be transmitted comprising the steps of:
   generating a first control signal and a second control signal which represent a first selected gain and a second selected gain, respectively;
   in response to the first control signal, modifying a signal level of the signal to be transmitted;

providing a feedback signal representative of a version of the signal to be transmitted having the modified signal level;

in response to the second control signal and the feedback signal, changing a power level of the signal to be transmitted; and attenuating the feedback signal by a predetermined amount.

33. The method of claim 32 wherein the signal to be transmitted represents a selected symbol.

34. The method of claim 33 wherein the symbol is selected in accordance with a QPSK scheme.

35. A method for use in a system for communicating a signal comprising the steps of:

feeding a version of the signal back to the system;

imparting a feedback gain to the version of the signal in response to a power level of the signal;

imparting a feedforward gain to the signal in response to the version of the signal; and selecting values of the feedforward gain and the feedback gain to control a power level of the signal.

36. The method of claim 35 wherein the values of the feedforward gain and the feedback gain are selected in response to a change in the power level of the signal.

37. A method for use in a system for communicating a signal comprising the steps of:

adjusting a power level of the signal;

feeding a version of the signal back to the system;

imparting a feedforward gain to the signal in response to the version of the signal for changing the power level of the signal;

imparting a feedback gain to the version of the signal for changing the power level of the signal;

attenuating the version of the signal by a predetermined amount;

measuring a difference between a phase of the version of the signal and that of the signal when the power level of the signal is adjusted to a selected level; and substantially aligning the phase of the version of the signal with the phase of the signal in response to the measured phase difference.

38. The method of claim 37 further comprising the step of adjusting the phase of the version of the signal based on the difference.

39. The method of claim 38 wherein the phase of the version of the signal is adjusted by incorporating the difference into a demodulating carrier for demodulation of the version of the signal.

40. The method of claim 37 further comprising the step of comparing an amplitude of the version of the signal with that of the signal.

41. The method of claim 37 wherein the power level of the signal is a function of a difference between an amplitude of the version of the signal and that of the signal.

* * * * *

UNITED STATES PATENT AND TRADEMARK OFFICE
CERTIFICATE OF CORRECTION

PATENT NO.      : 6,466,628 B1
DATED           : October 15, 2002
INVENTOR(S)     : Helen Haeran Kim It is certified that error appears in the above-identified patent and that said Letters Patent is hereby corrected as shown below:

<u>Title page,</u>
Item [56], References Cited, U.S. PATENT DOCUMENTS, the following patent number should be inserted:
-- 5,193,223     3/09/93       Walczak et al.   445/115 --

Signed and Sealed this

Eighteenth Day of March, 2003

JAMES E. ROGAN
*Director of the United States Patent and Trademark Office*